(12) United States Patent
Cremonesi et al.

(10) Patent No.: US 9,007,133 B2
(45) Date of Patent: Apr. 14, 2015

(54) OSCILLATOR, TIME-DIGITAL CONVERTER CIRCUIT AND RELATING METHOD OF TIME-DIGITAL MEASURE

(75) Inventors: Giovanni Cremonesi, Fiorenzuola (IT); Roberto Giorgio Bardelli, Fino Mornasco (IT); Silvio Fornera, Piateda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 428 days.

(21) Appl. No.: 13/452,496

(22) Filed: Apr. 20, 2012

(65) Prior Publication Data
US 2012/0262240 A1 Oct. 18, 2012

Related U.S. Application Data

(63) Continuation-in-part of application No. PCT/EP2010/006435, filed on Oct. 21, 2010.

(30) Foreign Application Priority Data
Oct. 21, 2009 (IT) .............................. MI2009A1817

(51) Int. Cl.
*H03K 3/03* (2006.01)
*H03K 23/54* (2006.01)

(52) U.S. Cl.
CPC ............ *H03K 3/0315* (2013.01); *H03K 23/542* (2013.01)

(58) Field of Classification Search
USPC ...................... 331/57; 327/141, 142
See application file for complete search history.

(56) References Cited

U.S. PATENT DOCUMENTS

| 4,517,532 | A | 5/1985 | Neidorff |
| 2002/0063605 | A1 | 5/2002 | Boerstler |
| 2002/0097098 | A1* | 7/2002 | Tang ................................ 331/57 |
| 2007/0273451 | A1* | 11/2007 | Osvaldella ..................... 331/57 |
| 2010/0102891 | A1* | 4/2010 | Nissar et al. .................... 331/57 |

FOREIGN PATENT DOCUMENTS

| EP | 1967860 A1 | 9/2008 |
| JP | 2008102083 | 5/2008 |
| WO | 2009/019743 A1 | 2/2009 |

* cited by examiner

*Primary Examiner* — Joseph Chang
*Assistant Examiner* — Jeffrey Shin
(74) *Attorney, Agent, or Firm* — Seed IP Law Group PLLC

(57) ABSTRACT

A ring oscillator has a plurality of elementary units connected in cascade and linked in order to make a chain with the respective output terminals connected to the input terminals of the successive elementary units of the chain, the elementary units being crossed by a cyclic signal during a time period of activation, each of said elementary units comprising an auxiliary recovery terminal for temporarily resetting each elementary unit during each loop of said cyclic signal, said auxiliary recovery terminal being connected to an output terminal of a successive elementary unit of the chain.

39 Claims, 13 Drawing Sheets

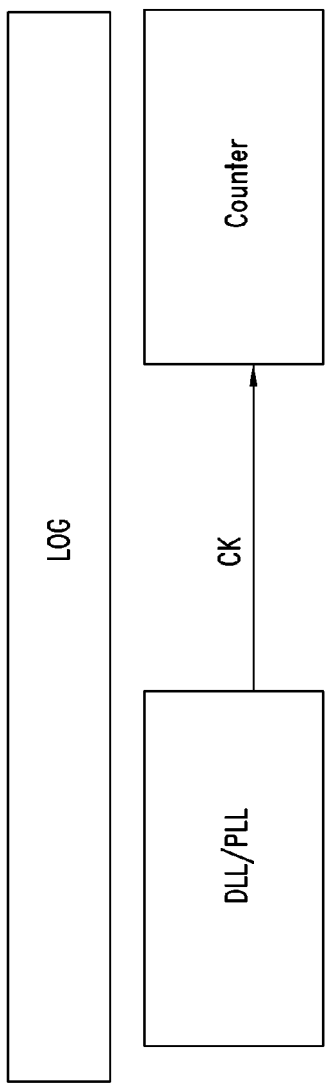
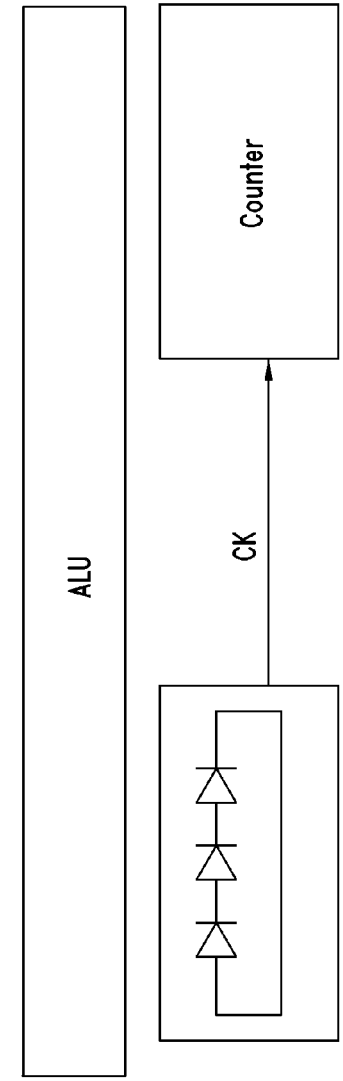
FIG. 4
(Prior Art)
FIG. 5
(Prior Art)

OSCILLATOR, TIME-DIGITAL CONVERTER CIRCUIT AND RELATING METHOD OF TIME-DIGITAL MEASURE

BACKGROUND

1. Technical Field

The present disclosure relates to a ring oscillator.

2. Description of the Related Art

A Time-to-Digital Converter circuit or TDC is substantially a circuit that measures a time period and converts it into a digital number.

The time period considered can be a period of time between a start signal and a stop signal, as for example those shown in FIG. 1. Alternatively, it is possible to consider for example the activation period of a digital signal.

Time-to-Digital converter circuits are used in several circuits, such as for example:

- circuits for the digital pulse width modulation or PWM, wherein the information is coded in the form of duration in time of each pulse;
- circuits for the determination of the distortion of the harmonics in a signal as THD (acronym of Total Harmonic Distortion), for example in a transmission channel;
- analog-to-digital ramp converter circuits or Ramp ADCs;
- circuits for the driving of bridges with digital signals, wherein it is necessary to execute a conversion of a digital signal supplied at the input in a time period;
- and other similar circuits.

During the last years different solutions have been developed and proposed, suitable for improving the performances of these converters.

One solution is shown for example in FIG. 2 and provides the use of a counter that counts how many pulses of a clock signal CLK are received between a start signal Start and a stop signal Stop. In some cases, the start signal can be the same pulse signal CLK.

This solution, although simple and advantageous, however has some drawbacks. In fact, the time periods that can be measured are long or short but must necessarily be greater than the pulse of the pulse signal CLK, that, up to date, is in the order of the tens of nanoseconds. This converter circuit A/D thus has a very low resolution.

A second solution that tries to overcome this drawback is shown in FIG. 3. In this case, the converter circuit proposed comprises a plurality of Flip-Flops being connected in cascade to each other and having respective output terminals connected to a logic circuit LOG. In particular, each Flip-Flop substantially receives two input signals: a cyclic or clock CLK signal and a State signal. The clock signal CLK is supplied by a detector through a first logic gate and propagated from a Flip-Flop to the other by means of the interposition of a plurality of inverters in cascade. The detector also supplies through a second input logic gate the State signal to an input terminal of each Flip-Flop, that receives it with a predetermined delay dues to the offset timing realized by the clock signal CLK delayed by the plurality of inverters.

The logic circuit LOG, at the arrival of the stop signal Stop, tests the status of the Flip-Flops, in particular the signals present on the output terminals connected thereto, and on the basis of this status, by means of suitable processing, supplies the digital value corresponding to the activation time period of the converter, i.e., of the time elapsed between the Start and Stop signals.

The converter just described thus measures the time period by means of Flip-Flops and thus the speed of the counter is substantially defined by the speed of these logic elements that, at present, is in the order of 100 ps. Moreover, for measuring long time periods it is necessary to increase the number of the Flip-Flops in cascade.

This second solution, although advantageous and with a good resolution, is thus convenient only for the conversion of short time periods, with a reduced number of Flip-Flops to be used, while it is little attractive for the conversion of long time periods due to the increase of the integration area requested as well as to the corresponding high consumption in terms of power.

A third solution is shown in FIG. 4. This solution provides to use a phase-locked circuit or PLL (acronym of "Phase-Locked Loop") or a DLL circuit (acronym of "Delay Locked Loop") able to generate a signal with a same frequency as that of an external reference clock signal CLK and whose phase has a fixed relation with that of this reference signal. A converter of this type essentially comprises a counter, which allows to count the loops of the clock signal in the ring of the PLL/DLL circuit between a start signal and a stop signal, this number of loops being the integer part of the value of the time period elapsed between the Start and Stop signals. The converter also comprises a logic LOG that allows to determine, according to the position of the clock signal inside the circuit itself, a fractional part of the value of this time period.

This solution, although accurate and attractive with respect to the previous ones, shows a high complexity. In fact, the PLL/DLL circuit is rather complex to be realized and requires a rather big integration area.

A further solution suitable for solving these drawbacks is shown in FIG. 5. The converter circuit is in this case realized by means of a ring oscillator made of an odd number of inverters placed in cascade and crossed by a clock signal. A counter connected to this ring oscillator counts the loops of the clock signal in the time period between a start signal Start and a stop signal Stop. Finally, an Arithmetic Logic Unit ALU, connected to the counter and to the ring oscillator, with suitable mathematic operations determines a value corresponding to the duration of the time period elapsed between these signals. This value comprises an integer part determined by the number of loops counted by the counter by the number of inverters of the ring oscillator and a fractional part determined according to the detection of the active inverter at the arrival of the stop signal Stop.

The substitution of the circuit DLL/PLL with the ring oscillator remarkably simplifies the realization of the analog part of the converter circuit and remarkably reduces the integration area required. However, the ring oscillator requires for its operation a necessarily odd number of inverters which exacerbates and makes it more complex at the circuit level the logic arithmetic unit to be used in couple with this ring oscillator.

BRIEF SUMMARY

In an embodiment, a ring oscillator comprises a plurality of cascade-connected elementary units linked in order to make a chain with the respective output terminals connected to the input terminals of the successive elementary units of the chain, the elementary units being crossed by a cyclic signal during an activation time period.

In an embodiment, a Time-to-Digital converter circuit for the digital conversion of a time period comprises: a ring oscillator enabled in the time period and crossed by a cyclic signal; and a loop counter connected to the ring oscillator for counting the loops the cyclic signal executes in the ring oscillator during the time period.

In an embodiment, a TDC comprises a ring oscillator which can be realized with any integer number, even or odd, of elementary units occupying a reduced integration area, and a simplified converter circuit having a high resolution both for long and reduced time periods as well as of a corresponding method of Time-to-Digital measure. In an embodiment, a TDC may implement an A/D converter.

In an embodiment, each elementary unit of a ring oscillator is brought back to a known logic state at each loop of the cyclic signal before this signal goes back into the same elementary unit by means of an inner timing of the ring oscillator.

In an embodiment, a ring oscillator comprises a plurality of elementary units being connected in cascade and linked in order to make a chain with the respective output terminals connected to the input terminals of the successive elementary units of the series, said elementary units being crossed by a cyclic signal during an activation time period, characterized in that each of said elementary units further comprises an auxiliary recovery terminal for temporarily resetting each elementary unit during each loop of said cyclic signal, said auxiliary recovery terminal being connected to an output terminal of a successive elementary unit of said chain.

In an embodiment, each of said elementary units, of the ring oscillator, comprises a non-inverting logic element that brings back to its own output terminal the same propagating edge of said cyclic signal present at its own input terminal. In an embodiment the propagating edge is a rising edge. In an embodiment, the propagating edge is a falling edge.

In an embodiment, the non-inverting logic element comprises a first logic block connected to the input terminal and connected, in cascade, to an output logic block that is in turn connected to the output terminal.

In an embodiment, each elementary unit comprises, moreover, a second logic block connected to the input terminal and connected to the output logic block, the second logic block comprising a two-state memory element.

According to an embodiment, the first logic block, the second logic block and the output logic block are of the inverting type.

In an embodiment, the elementary unit comprises a third logic block connected to the auxiliary recovery terminal and to the output logic block, said third logic block being non inverting.

In an embodiment, this third logic block is further connected to a second deactivation terminal and to a third recover terminal of the elementary unit through a control element.

In an embodiment, the elementary unit comprises a state element interposed between the auxiliary recovery terminal and said two-state memory element of said second inverting block, the state element being of the non-inverting type.

In an embodiment, said auxiliary recovery terminal of each elementary unit of the chain is connected to an output terminal of a second successive elementary unit of said chain.

In an embodiment, a Time-to-Digital converter circuit for the digital conversion of a time period comprises a ring oscillator activated in the time period and crossed by a cyclic signal, a loop counter connected to the ring oscillator for counting the loops the cyclic signal executes in the ring oscillator during the time period, characterized in that the ring oscillator is realized according to the present disclosure.

In an embodiment, the Time-to-Digital converter circuit comprises a state decoder connected to the ring oscillator for determining the position of the cyclic signal in said ring oscillator at the end of the time period.

The ring oscillator of the Time-to-Digital converter circuit can comprise a number of elementary units corresponding to a power of two.

Moreover, advantageously, in an embodiment the loop counter is made by means of a chain of two-state memory elements.

In an embodiment, a method for making a ring oscillator comprises the steps of:
arranging a series of elementary units in cascade and linked in order to make a chain with the input terminal of an elementary unit connected to the output terminal of a successive elementary unit of the chain;
enabling a cyclic signal during an activation time period of said ring oscillator, said cyclic signal crossing said elementary units;
characterized in that it further comprises temporarily resetting each elementary unit during each loop of said cyclic signal by means of inner feedback, in said ring oscillator, of an auxiliary recovery signal.

In an embodiment, the method then provides to connect by means of inner feedback an output terminal of a successive elementary unit of the chain to an auxiliary recovery terminal of an elementary unit suitable for receiving said auxiliary recovery signal.

In an embodiment, the method also comprises the step of:
realizing in each elementary unit a first fast transmission path for said cyclic signal by means of a non-inverting logic element that brings back to its own output terminal a same propagating edge (e.g., rising or falling edge) of the cyclic signal present at the respective input terminal.

In an embodiment, the step of making said non-inverting logic element provides to make a first logic block connected to said input terminal and connected to an output logic block connected to said output terminal.

In an embodiment, the step of making the elementary units provides to make a second path of confirmation of said cyclic signal providing a second logic block connected to the input terminal and to said output logic block and providing in the second logic block a two-state memory element.

In an embodiment, the method provides of making a third fast transmission path of said auxiliary recovery signal, by arranging a third logic block connected to the auxiliary recovery terminal and to said output logic block, as well as of making a fourth path of confirmation of said auxiliary recovery signal, it also provides the arrangement of a state element connected to said auxiliary recovery terminal and to said two-state memory element of said second logic block.

In an embodiment, a time-to-digital measure method for converting a time period $\Delta t$ into a digital number DIG comprises the following steps: making a ring oscillator by arranging a plurality of elementary units in cascade linked in order to make a chain with the input terminal of an elementary unit connected to the output terminal of a successive elementary unit of the chain; activating the ring oscillator for the time period enabling a cyclic signal that crosses in sequence the elementary units; counting the loops of the cyclic signal in the ring oscillator during the time period and determining the elemental unit of the ring oscillator comprising the cyclic signal at the end of the time period; characterized in that said step of realizing the ring oscillator is obtained according to the disclosure.

In an embodiment, the measuring method can provide to arrange the elementary units in a number corresponding to a power of two.

In an embodiment, the step of counting the loops provides the step of arranging a counter of loops by connecting the output of said ring oscillator to an input of the loop counter, this loop counter being realized by means of a chain of two-state memory elements.

In an embodiment, a ring oscillator comprises a plurality of elementary units coupled together in cascade and configured to form a chain with respective output terminals coupled to input terminals of successive elementary units of said chain, said elementary units being crossed by a cyclic signal during a time period of activation, wherein each of said elementary units comprises an auxiliary recovery terminal coupled to an output terminal of a successive elementary unit in said chain, and each elementary unit is configured to temporarily reset itself during each loop of said cyclic signal. In an embodiment, each of said elementary units comprises a non-inverting logic element configured to provide at the output terminal of the respective elementary unit a same rising edge of said cyclic signal present at the input terminal of the respective elementary unit. In an embodiment, said non-inverting logic element comprises a first logic block coupled to said input terminal and coupled in cascade to an output logic block coupled to the output terminal. In an embodiment, said elementary unit comprises a second logic block coupled to said input terminal and to said output logic block, said second logic block comprising a two-state memory element. In an embodiment, said first logic block, said second logic block and said output logic block are of an inverting type. In an embodiment, each of said elementary units comprises a third logic block coupled to said auxiliary recovery terminal, to said output logic block and to said second block, said third logic block being non-inverting. In an embodiment, wherein said third logic is further connected to a deactivation terminal and to a recover terminal of said elementary unit through a control element. In an embodiment, said elementary unit comprises an element interposed between said auxiliary recovery terminal and said two-state memory element of said second logic block, said state element being of a non-inverting type. In an embodiment, said auxiliary recovery terminal of each elementary unit of the chain is connected to an output terminal of a successive second elementary unit of said chain.

In an embodiment, a Time-to-Digital converter comprises: a ring oscillator configured to be activated for a time period and crossed by a cyclic signal, the ring oscillator including a plurality of elementary units coupled together in cascade and configured to form a chain with respective output terminals coupled to input terminals of successive elementary units of said chain, said elementary units being crossed by the cyclic signal during the time period of activation, wherein each of said elementary units comprises an auxiliary recovery terminal coupled to an output terminal of a successive elementary unit in said chain, and each elementary unit is configured to temporarily reset itself during each loop of said cyclic signal; and a loop counter coupled to said ring oscillator and configured to count loops that said cyclic signal executes in said ring oscillator during said time period. In an embodiment, the Time-to-Digital converter further comprises a state decoder associated with said ring oscillator and configured to determine a position of the cyclic signal in said ring oscillator at an end of said time period. In an embodiment, said ring oscillator comprises a number of elementary units corresponding to a power of two. In an embodiment, said loop counter comprises a chain of two-state memory elements.

In an embodiment, a method comprises: arranging a series of elementary units in cascade and linked to make a chain with an input terminal of an elementary unit coupled to an output terminal of a proceeding elementary unit of said chain, said chain forming a ring oscillator; enabling a cyclic signal during a time period of activation of said ring oscillator, said cyclic signal crossing said elementary units; and temporarily resetting each elementary unit during each loop of said cyclic signal in response to inner feedback, in said ring oscillator, of an auxiliary recovery signal. In an embodiment, the method further comprises coupling an output terminal of a successive elementary unit of the chain with an auxiliary recovery terminal, of a preceding elementary unit, configured to receive said auxiliary recovery signal. In an embodiment, the method comprises: providing in each elementary unit a first fast transmission path for said cyclic signal through a non-inverting logic element, the first fast transmission path configured to provide at the output terminal a same rising edge of said cyclic signal present at the respective input terminal. In an embodiment, the method comprises: providing in each elementary unit a first fast transmission path for said cyclic signal through a non-inverting logic element, the first fast transmission path configured to provide at the output terminal a same falling edge of said cyclic signal present at the respective input terminal. In an embodiment, the method comprises configuring in cascade a first logic block coupled to said input terminal and an output logic block coupled to said output terminal to form said first fast transmission path. In an embodiment, the method comprises providing a path of confirmation of said cyclic signal through a second logic block coupled to said input terminal and to said output logic block, wherein said second logic block comprises a two-state memory element. In an embodiment, the method comprises: providing a fast transmission path of said auxiliary recovery signal through a third logic block coupled to the auxiliary recovery terminal and to said output logic block; and providing a path of confirmation of said auxiliary recovery signal through a state element coupled to said auxiliary recovery terminal and to said two-state memory element of said second logic block. In an embodiment, the method further comprises: counting loops of said cyclic signal in said ring oscillator during said time period; determining an elementary unit of said ring oscillator comprising said cyclic signal at an end of said time period; and generating a digital number representing the time period based on the counting and the determining. In an embodiment, arranging said chain comprises arranging a number of elementary units corresponding to a power of two. In an embodiment, said counting loops comprises coupling an output of said ring oscillator to an input of a loop counter comprising a chain of two-state memory elements.

In an embodiment, a ring oscillator comprises: a plurality of elementary units coupled together to form a ring of elementary units, each elementary unit having: a cyclical signal input; and an output coupled to the cyclical signal input of a successive elementary unit of the ring; and a ring oscillator output coupled to the output of one of the elementary units of the ring, wherein each elementary unit is configured to temporarily reset during a cycle of the ring oscillator. In an embodiment, each of the plurality of elementary units comprises a recovery input coupled to the output of another elementary unit of the ring, and is configured to temporarily reset in response to receiving a signal on the recovery input. In an embodiment, the output of a respective elementary unit is coupled to the cyclical signal input of a first successive elementary unit of the ring and to the recovery input of a second preceding elementary unit of the ring. In an embodiment, the elementary units are non-inverting logic elements. In an embodiment, a non-inverting logic element of a respective elementary unit comprises a first logic block and an output logic block coupled in series between the cyclical input terminal and the output terminal of the respective elementary unit. In an embodiment, said respective elementary unit comprises a second logic block coupled in series with the output logic block between the cyclical input terminal and the output terminal of the respective elementary unit, said second logic block comprising a two-state memory element. In an embodiment, said first logic block, said second logic block and said output logic block are of an inverting type. In an embodiment, said respective elementary unit comprises a third logic block coupled in series with the output logic block between the recovery terminal and the output terminal of the respective elementary unit, said third logic block being non inverting. In an embodiment, a respective elementary unit comprises a state element configured to output a signal indicative of a state of the respective elementary unit. In an embodiment, the plurality of elementary units comprises an even number of elementary units. In an embodiment, the even number is a power of two.

In an embodiment, a system comprises: a ring oscillator, including: a plurality of elementary units coupled together to form a ring of elementary units, each elementary unit having: a cyclical signal input; and an output coupled to the cyclical signal input of a successive elementary unit of the ring; and a ring oscillator output coupled to the output of one of the elementary units of the ring, wherein each elementary unit is configured to temporarily reset during a cycle of the ring oscillator; and a loop counter coupled to the output of the ring oscillator and configured to count cycles of the ring oscillator during a time period. In an embodiment, the system further comprises a state decoder coupled to the plurality of elementary units and configured to determine a position of a cyclical signal in the ring oscillator at an end of the time period. In an embodiment, the plurality of elementary units comprises an even number of elementary units which is a power of two. In an embodiment, the loop counter comprises a chain of two-state memory elements.

In an embodiment, a system comprises: a plurality of means for following a cyclical input signal coupled together in a loop; and means for temporally resetting the means for following during a cycle of the loop. In an embodiment, the system further comprises means for counting cycles of the loop during a time period. In an embodiment, the system further comprises means for decoding a state of the plurality of means for following.

BRIEF DESCRIPTION OF THE SEVERAL VIEWS OF THE DRAWINGS

In these drawings:

FIGS. 2-5 schematically show converter circuits A/D of the known type;

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations, such as, for example, details of inverters and counters, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
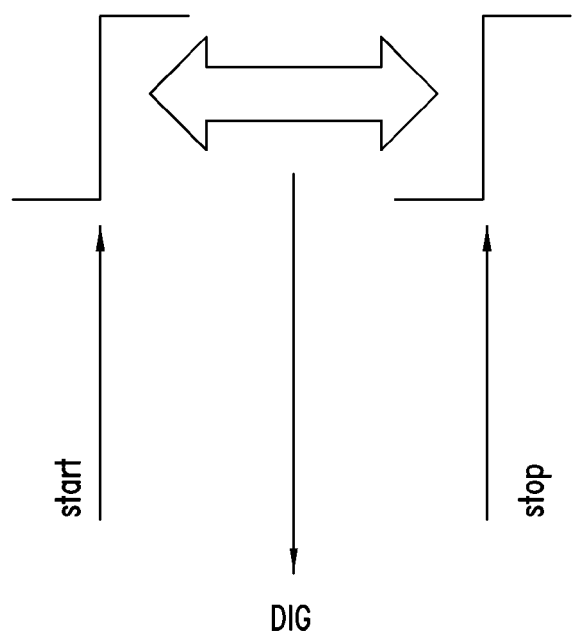
FIG. 1 schematically shows a time period to be quantified, in particular between a start signal Start and a stop signal Stop.
Figure 2:
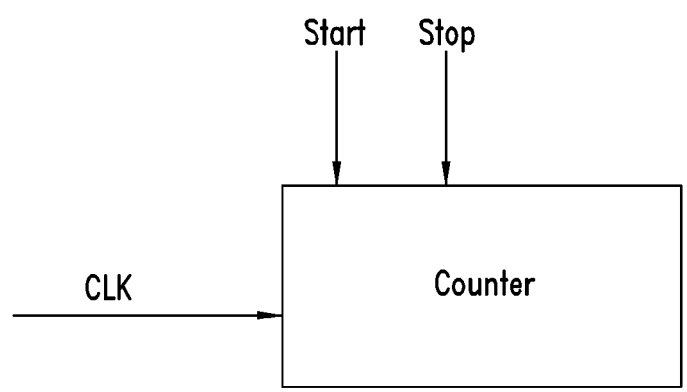
Figure 3:
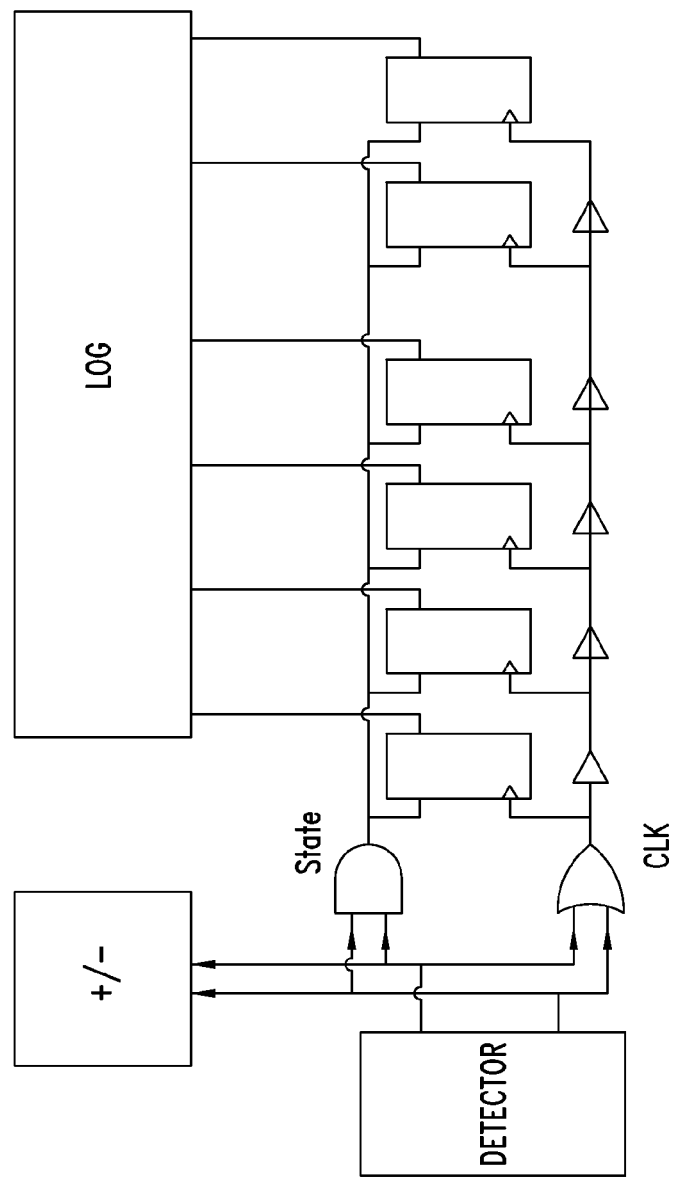
Figure 6:
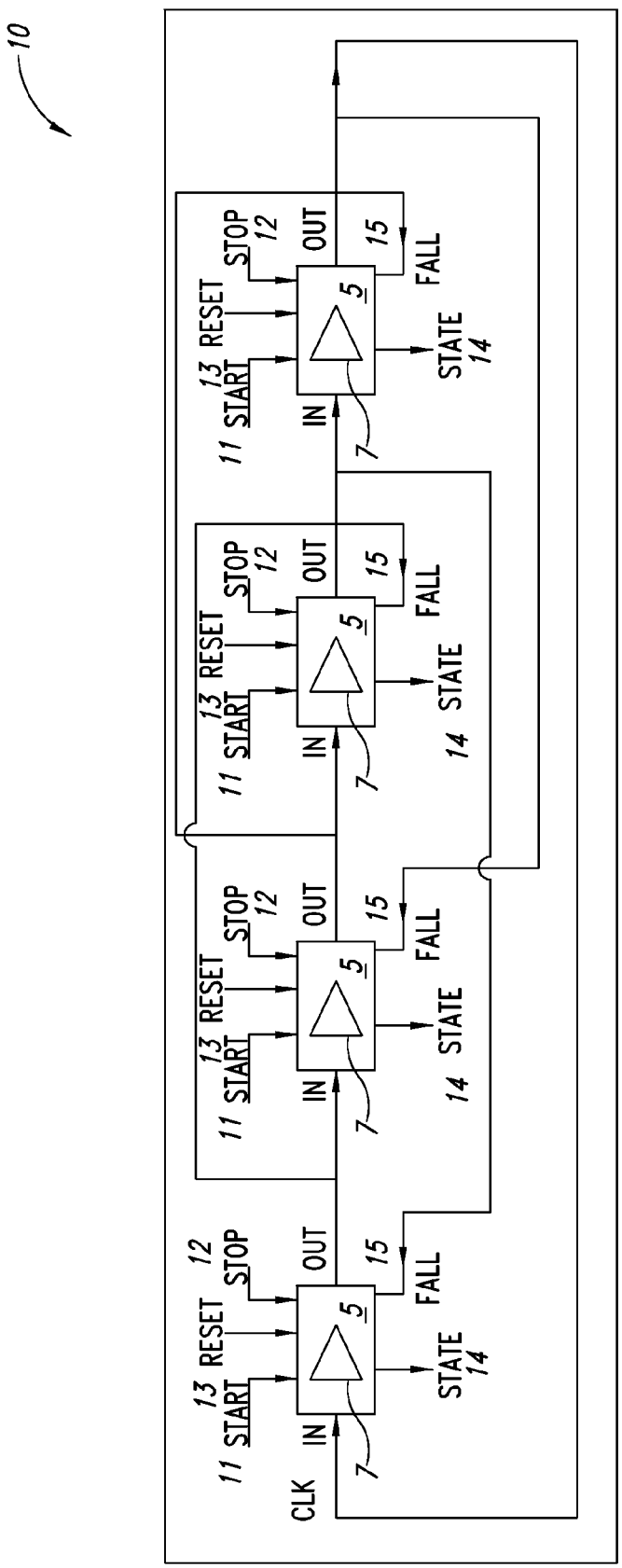
FIG. 6 schematically shows a ring oscillator according to the an embodiment.

Referring to FIG. 6, a ring oscillator 10 comprises a plurality of elementary units 5 arranged in cascade and linked to each other in order to make a chain, with the output terminal OUT of each elementary unit 5 coupled to the input terminal IN of one successive elementary unit 5 and with the output terminal OUT of the last elementary unit 5 of the chain being feedback coupled to the input terminal IN of the first elementary unit 5 of the chain.

According to the illustrated embodiment, the elementary units 5 are four, their number however could be indifferently even or odd, in a different way with respect to what happens for known circuits, as it will be clearer hereafter in the description.

The ring oscillator 10 at the receipt of a start signal Start enables an inner cyclic signal CLK or clock signal that is disabled at the receipt of a stop signal Stop. The start signal Start is suitably received by one of the elementary units 5 in correspondence with a respective first activation terminal 11, and the stop signal Stop is simultaneously received in each elementary unit 5 at a second deactivation terminal 12.

Each elementary unit 5 also has a third recovery terminal 13 suitable for receiving a recovery signal RESET for bringing each elementary unit 5 back to a known state prior to any activation, by means of the start signal Start, of the ring oscillator 10.

Moreover, each elementary unit 5 has a fourth state terminal 14 suitable for supplying a state signal STATE of the same elementary unit 5.

Further, each elementary unit 5 has an auxiliary recovery terminal 15 that receives an auxiliary recovery signal FALL suitable for temporarily resetting the corresponding elementary unit 5 during each loop of the cyclic signal CLK.

In an embodiment, each elementary unit 5 comprises a non-inverting logic element 7 that brings back to one of its own output terminals OUT a same rising or falling edge of the cyclic signal CLK present at one of its input terminals IN.

Moreover, according to an embodiment, the auxiliary recovery terminal 15 of each elementary unit 5 is suitably coupled to the output terminal OUT of a successive elementary unit 5 of the chain, for receiving, in inner feedback, the signal present at the output terminal OUT as auxiliary recovery signal FALL.

According to an embodiment, the auxiliary recovery terminal 15 is coupled to the output terminal of the second successive elementary unit 5 of the chain. Naturally, this connection can occur for a different elementary unit 5 in order to meet specific layout requirements.

In any case, differently from the prior art, during the operation each elementary unit 5 brings back to its own output terminal OUT the same rising edge of the cyclic signal CLK present at its own input terminal IN.

Moreover, due to the inner feedback, the ring oscillator 10 generates an inner clocked recovery signal for each elementary unit 5. In fact, during each loop of the cyclic signal CLK, the signal present at the output terminal OUT of an elementary unit 5 generates the auxiliary recovery signal FALL, which temporarily resets at a known state a preceding elementary unit 5 of the chain before the arrival at this preceding elementary unit 5 of a successive edge of the cyclic signal CLK.

As regards the operation, as schematically shown in FIGS. 7A-7D, in the beginning all the elementary units 5 are brought back to a known state, for example to a low logic state or "0" by means of receipt of the recovery signal RESET at the third recovery terminal 13. Subsequently, the first activation terminal 11 of an elementary unit 5 of the chain receives the start signal START and a cyclic signal CLK is enabled. Naturally, the selection of the elementary unit 5 which receives the start signal START is purely a design choice.

Figure 7A:
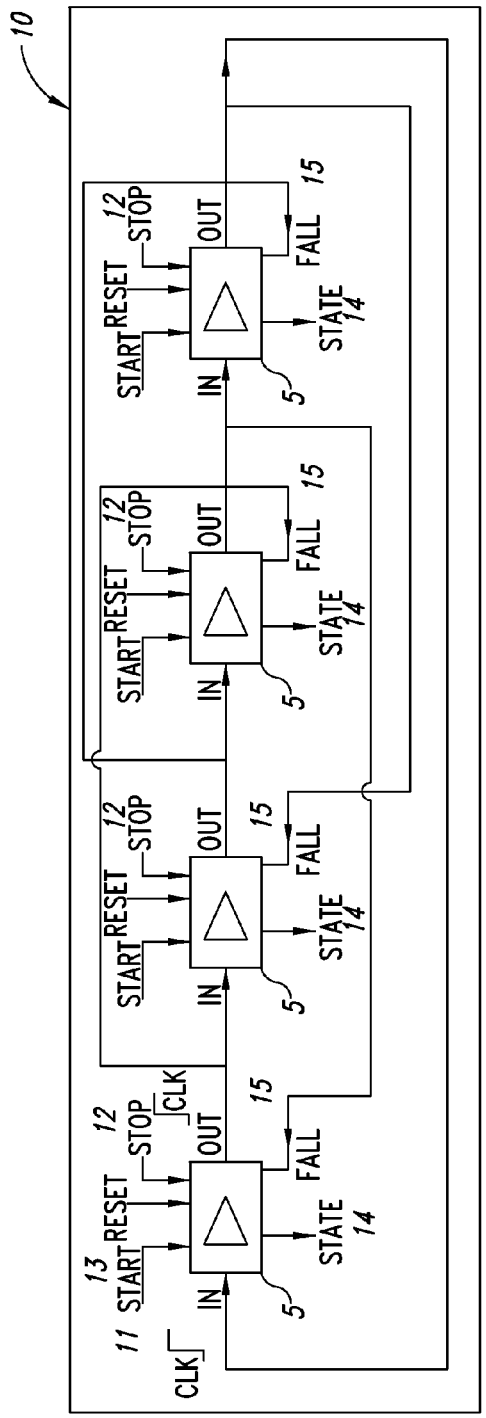
FIGS. 7A-7D schematically show the operation of the ring oscillator according to the scheme of FIG. 6 in a loop of a cyclic signal inside it.

In particular, as shown in FIG. 7A, if the rising edge of the cyclic signal CLK is present at the input terminal IN of the first elementary unit 5, it passes from the low logic state "0" to a high logic state or "1" and the rising edge of the cyclic signal CLK is transferred to its own output terminal OUT.

This rising edge of the cyclic signal CLK crosses in sequence each elementary unit 5 of the chain.

Figure 7B:
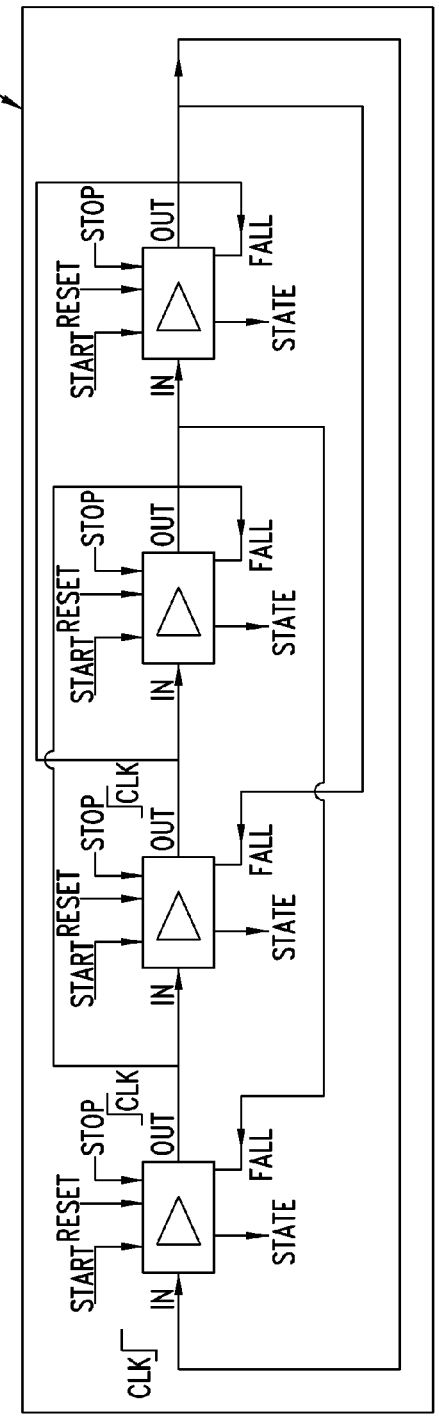

Subsequently, as shown in FIG. 7B, the cyclic signal CLK shows up at the input terminal of the second elementary unit 5 of the chain which also passes from the low logic state "0" to the high logic state or "1" and the rising edge of the cyclic signal CLK is transferred to its own output terminal OUT.

Figure 7C:
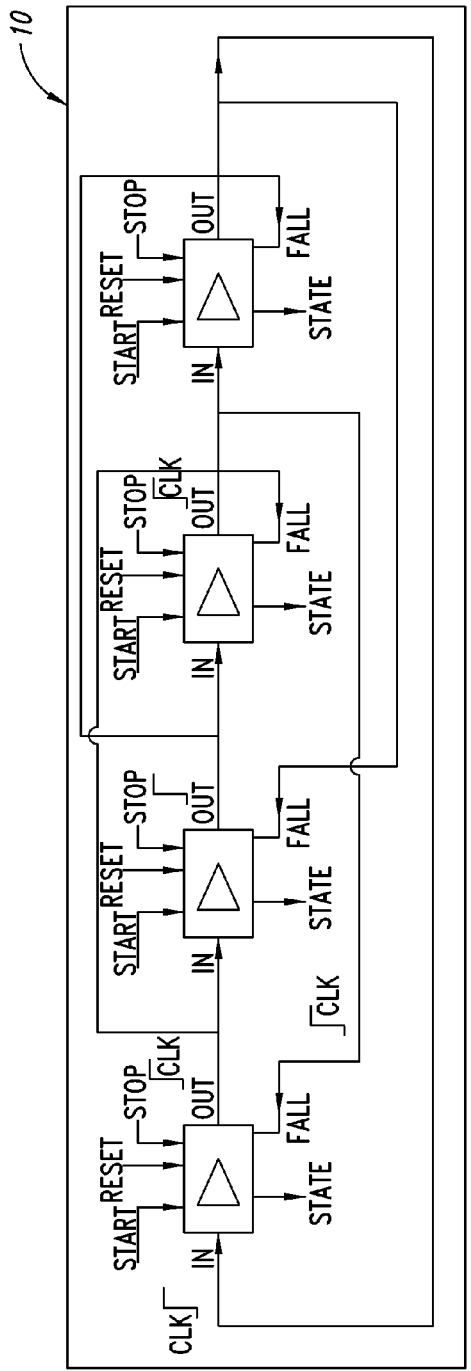
Figure 7D:
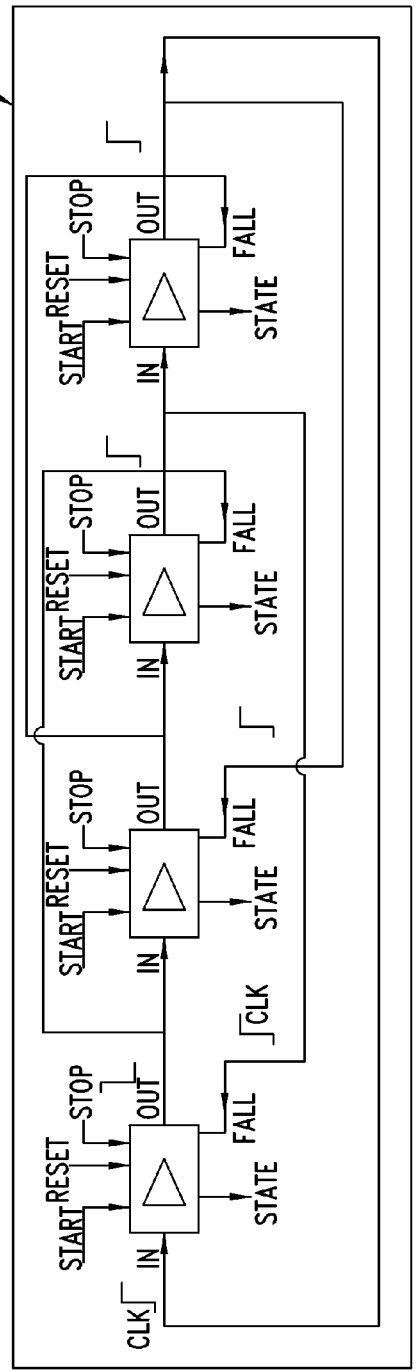

As shown in FIG. 7C, when the third elementary unit 5 is brought to the high logic state or "1", the signal at its own output terminal OUT is brought, in inner feedback, to the auxiliary recovery terminal 15 of the first elementary unit 5. This signal determines the auxiliary recovery signal FALL of the first elementary unit 5 which temporarily resets this first elementary unit 5 which is recovered at the initial low state or "0".

Simultaneously, the fourth elementary unit 5 is brought to the high logic state "1", by the same output signal OUT of the third elementary unit 5 of the chain, the rising edge of the cyclic signal CLK present at the output terminal OUT of the fourth elementary unit 5 being received at the input terminal IN of the first elementary unit 5. In this way, when the loop of the cyclic signal CLK is completed and a new rising edge is present at the input terminal IN of the first elementary unit 5 this elementary unit 5 has been previously recovered at the known state, dues to the auxiliary recovery signal FALL which, in the present embodiment, is the inner feedback of the signal present at the output terminal OUT of the third elementary unit 5.

In a similar way, the output terminal OUT of the fourth elementary unit 5 is brought back in inner feedback and coupled to the auxiliary recovery terminal FALL of the second elementary unit 5. In this way, when the fourth elementary unit 5 is brought to the high logic level, the second elementary unit 5 is temporarily reset at the initial state "0" before receiving again the rising edge of the cyclic signal CLK from the first elementary unit 5.

Similarly, the auxiliary recovery terminal 15 of the third elementary unit 5 is coupled to the output terminal OUT of the first elementary unit 5, while the auxiliary recovery terminal 15 of the fourth elementary unit 5 is coupled to the output terminal OUT of the second elementary unit 5.

Upon receipt of the stop signal STOP, at the second deactivation terminal 12, the cyclic signal CLK is interrupted and each fourth state terminal 14 supplies the state signal STATE of the corresponding elementary unit 5.

Naturally, the auxiliary recovery terminal 15 of each elementary unit 5 can be coupled in an arbitrary way to an output terminal OUT of any elementary unit 5 of the chain. The choice of this connection occurs according to circuit and layout needs.

Figure 8:
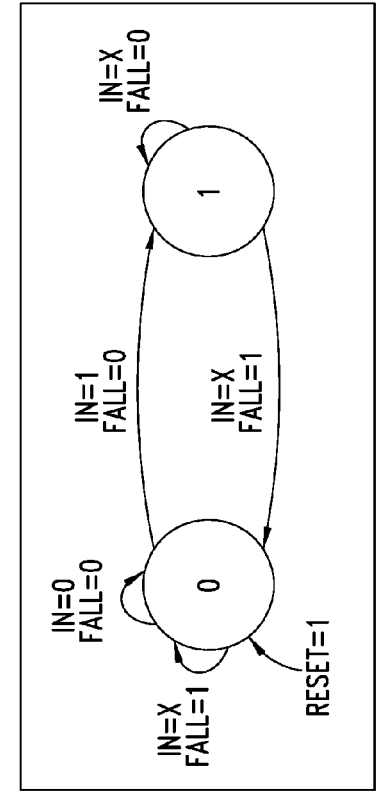
FIG. 8 shows a possible realization of an elementary unit of the ring oscillator of FIG. 6 according to a Moore's representation.

Each elementary unit 5 is a sequential machine and as such can be functionally represented, according to Moore's machine, as for example shown in FIG. 8.

The inputs for this representation are: the edge of the cyclic signal CLK at the input terminal IN, the auxiliary recovery signal FALL and the recovery signal RESET. The output is the edge of the signal present at the output terminal OUT which represents also the state of the elementary unit 5.

Mainly, when the start signal START is at high logic level "1", and the cyclic signal CLK is at high logic level "1", the recovery signal RESET brings the elementary unit 5 to the initial state "0" or low logic level "0", when the signal at the input terminal IN is at high logic level "1" and the auxiliary recovery signal FALL is at low logic level "0", the elementary unit 5 is brought at high logic level "1" and remains in this state as long as the auxiliary recovery signal FALL is at low logic level "0" independently from the value at the input terminal IN. When the auxiliary recovery signal FALL is brought to high logic level "1", independently from the signal present at the input terminal IN, the elementary unit 5 goes back to the initial state "0" or low logic level "0". Thus, the auxiliary recovery signal FALL dominates with respect to the signal present at the input terminal IN.

The elementary unit 5 remains in the initial state "0" or low logic level "0" as long as the signal at the input terminal IN is brought to high logic level "1" and the auxiliary recovery signal FALL is at low logic level "0", condition in which the elementary unit 5 is brought to high logic level "1".

Figure 9:
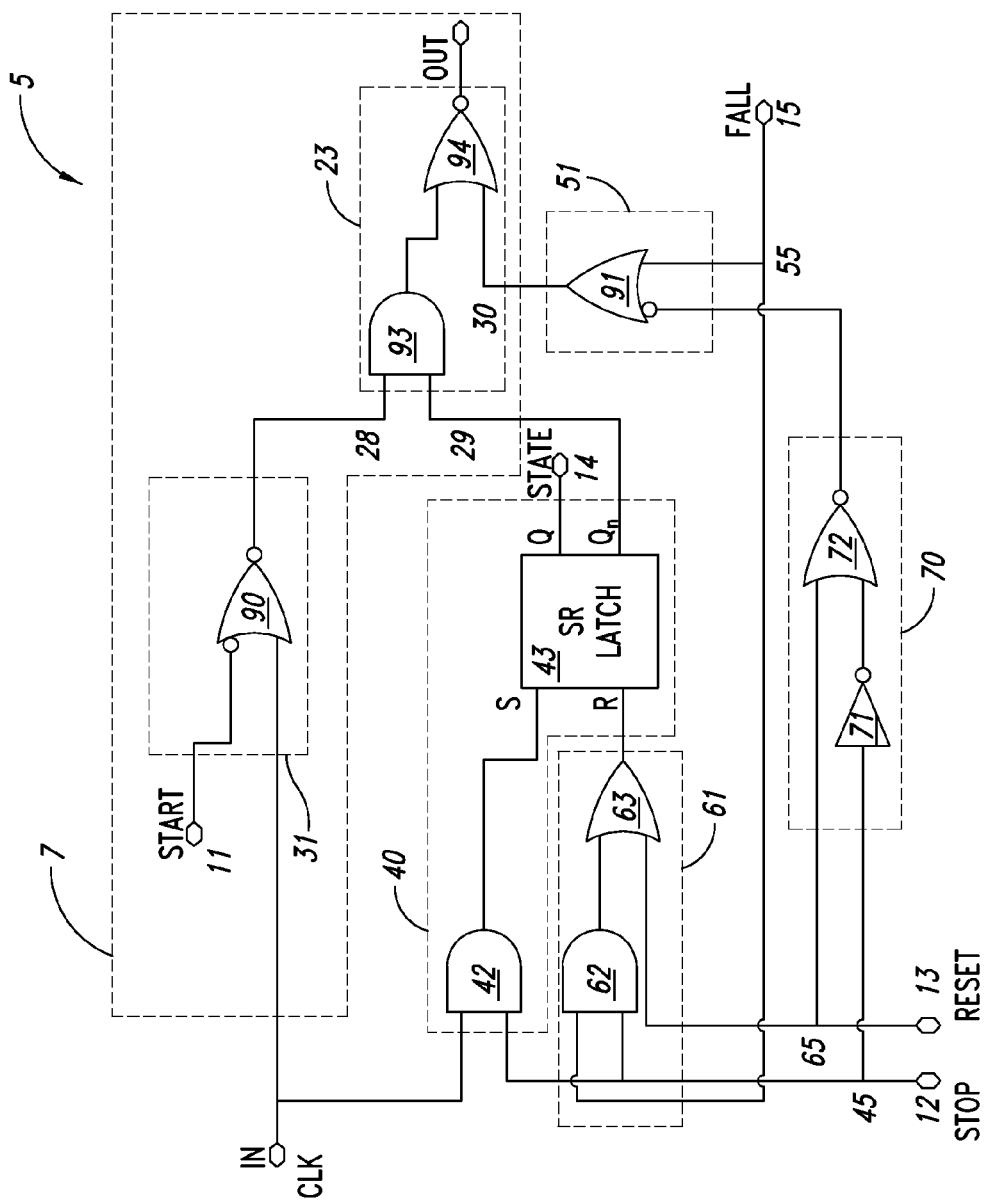
FIG. 9 schematically shows a block scheme of an elementary unit of the ring oscillator of FIG. 6.

The elementary units 5 of the ring oscillator 10 may be implemented in different embodiments. One example schematic embodiment is shown in FIG. 9 and substantially comprises a non-inverting logic element 7 interposed between the input terminal IN and the output terminal OUT. In the embodiment illustrated in FIG. 9, the signal Stop is active when low, and inactive when high.

The non-inverting logic element 7 substantially comprises two logic blocks coupled in cascade. In the present embodiment, these logic blocks are both of the inverting type. Naturally, in a different embodiment these logic blocks could be both non-inverting.

In particular, the non-inverting logic element 7 comprises a first logic block 31, of fast signal transmission, comprising a logic gate NOR, coupled in cascade to an output logic block 23, substantially realized as a logic gate AND-NOR with a single circuit stage.

The logic gate NOR of the first logic block 31 has a first input coupled to the input terminal IN and a second input, suitably negated, coupled to the first activation terminal 11 of the elementary unit 5, as well as an output coupled to the output logic block 23.

The logic gate AND-NOR of the output logic block 23 is a three-input logic gate with a first input 28 coupled to the output of the logic gate NOR of the first logic block 31, a second input 29 and a third input 30, as well as an output coupled to the output terminal OUT of the elementary unit 5.

According to an embodiment, the logic gate AND-NOR, realized with a single circuit stage, comprises a first logic gate 93 of the AND type coupled in cascade to a second logic gate 94 of the NOR type. The first logic gate 93 receives the first input 28 and the second input 29, moreover it has the output coupled to the first input of the second logic gate 94. The second logic gate 94 receives also the third input 30 while the output is coupled to the output terminal OUT of the elementary unit 5.

According to the illustrated embodiment, the elementary unit 5 also comprises a second logic block 40 of confirmation of the signal interposed between the input terminal IN and the second input 29 of the output logic block 23.

The second logic block 40 of acquisition and confirmation of the signal is also substantially an inverting element and comprises a logic gate 42, of the AND type, coupled in cascade to a two-state memory element, in particular a Latch 43 of the Set/Reset type.

The logic gate 42 of the second logic block 40 has a first input coupled to the input terminal IN of the elementary unit 5 and a second input coupled to a first inner circuit node 45, which is in turn coupled to the second deactivation terminal 12 of the elementary unit 5, suitable for receiving the stop signal STOP. The output of the logic gate 42 is coupled to a first input Set of the two-state element or Latch 43.

The Latch 43 has a second input Reset coupled to the output of a state element 61 and a first output Q coupled to the fourth state terminal 14, suitable for supplying the state of the elementary unit 5, and a second output QN coupled to the second input 29 of the output logic block 23.

The state element 61, of the non-inverting type, comprises a first logic gate 62 of the AND type coupled in cascade to a second logic gate 63 of the OR type.

In particular, the first logic gate 62 comprises a first input coupled to a second circuit node 55 coupled in turn to the auxiliary recovery terminal 15, suitable for receiving the auxiliary recovery signal FALL. The first logic gate 62 comprises a second input coupled to the first inner circuit node 45, coupled in turn to the second deactivation terminal 12 of the elementary unit 5. Moreover, the first logic gate 62 comprises an output coupled to a first input of the second logic gate 63.

The second logic gate 63 has a second input coupled to a third inner circuit node 65, coupled in turn to the third recovery terminal 13 of the elementary unit 5, as well as an output coupled to the second input Reset of the Latch 43.

The elementary unit 5 comprises a third logic block 51, of the non-inverting type, interposed between the auxiliary recovery terminal 15 and the third input 30 of the output logic block 23.

In particular, the third logic block 51 comprises a logic gate 91 of the OR type which has a first input coupled to the auxiliary recovery terminal 15 and a second input coupled to an output of a control element 70.

The control element 70 comprises a first inverting NOT logic gate 71 coupled in cascade to a second inverting NOR logic gate 72. In particular, the first logic gate 71 is interposed between the first inner circuit node 45 and a first input of the second logic gate 72, which has a second input coupled to the third inner circuit node 65, i.e., to the third recovery terminal 13. The control element 70 comprises an output which, suitably negated, is coupled to the third logic block 51.

In particular, as regards the operation of the elementary unit 5, according to the present embodiment, the first logic block 31 and the output logic block 23 define a first fast transmission path for the edge of the cyclic signal CLK which propagates quickly from the input terminal IN to the output terminal OUT. This allows, in particular, to minimize the propagation delay of the signal. Moreover, this fast transmission path has a low load capacity which allows to substantially reduce the power consumption of the elementary unit 5.

The second logic block 40 and the output logic block 23 define a second path of confirmation of the cyclic signal CLK present at the input terminal IN. The second path of confirmation of the cyclic signal CLK is slower with respect to the first path and in particular has the function of storing in a steady way, by means of the Latch 43, the edge of the cyclic signal CLK present at the input terminal IN and of ensuring, by means of the output logic block 23, that the same edge is transmitted to the output terminal OUT, ensuring a stability of the system against possible variations of the cyclic signal CLK at the input terminal IN.

Similarly, the third logic block 51 and the output logic block 23 define a third fast transmission path for the auxiliary recovery signal FALL present at the auxiliary recovery terminal 15. The auxiliary recovery signal FALL by means of the third path brings quickly the output terminal OUT back to the initial state.

Moreover, the state element 61 and the two-state memory element 43, of the second logic block 40, as well as the output logic block 23 define a fourth path of confirmation of the auxiliary recovery signal FALL. In particular, the fourth path stores in a steady way the auxiliary recovery signal FALL and ensures that the output terminal OUT of the elementary unit 5 is brought back to the initial state, thus ensuring a stability of the ring oscillator as a whole. Subsequently, when the auxiliary recovery signal FALL at the auxiliary recovery terminal 15 goes back to the low logic state, the elementary unit 5 is ready to receive a further cyclic signal CLK at the input terminal IN.

In fact, it is good to note that, according to the present embodiment of the output block 23, the third logic block 51 acts directly on the value of the output terminal OUT of the elementary unit 5 independently from the value of the first input 28 and of the second input 29, i.e., respectively of the first logic block 31 and of the second logic block 40.

The operation of an embodiment of the elementary unit 5 is described even more in particular with reference to FIGS. 10A-10D.

Figure 10A:
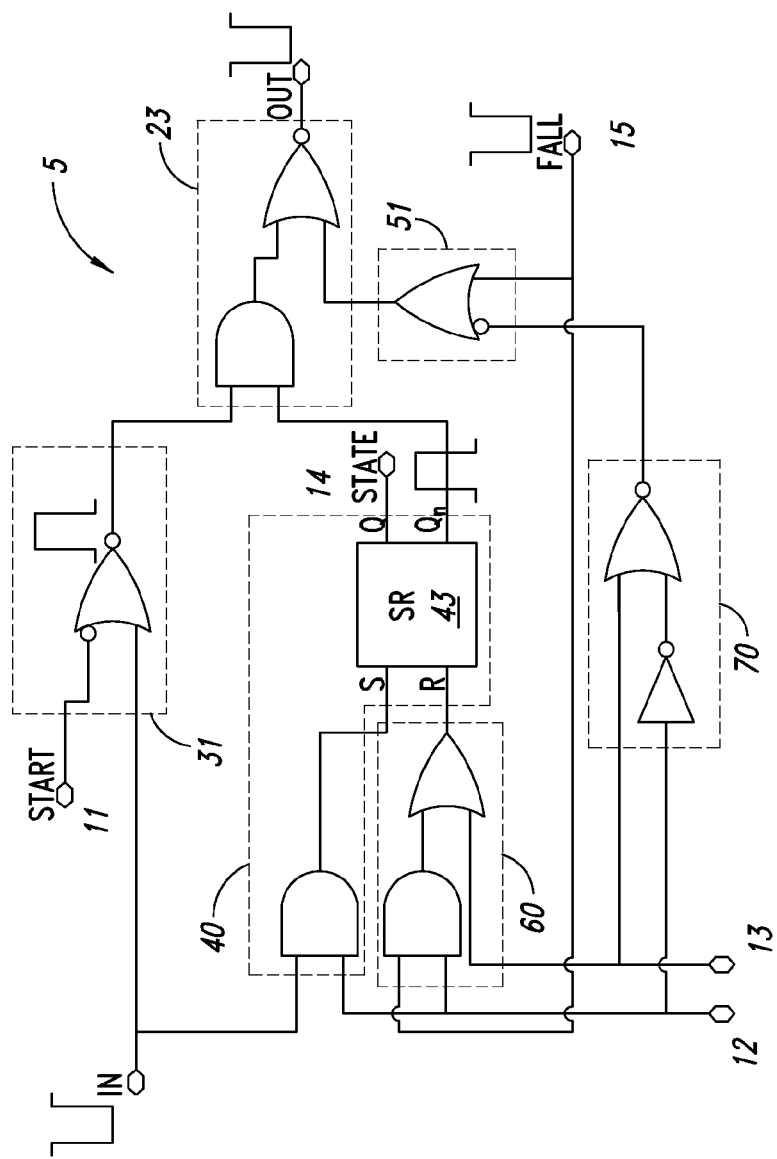
FIGS. 10A-10D schematically show the elementary unit of FIG. 9 where the variations of the signals during the operation are highlighted.
Figure 10B:
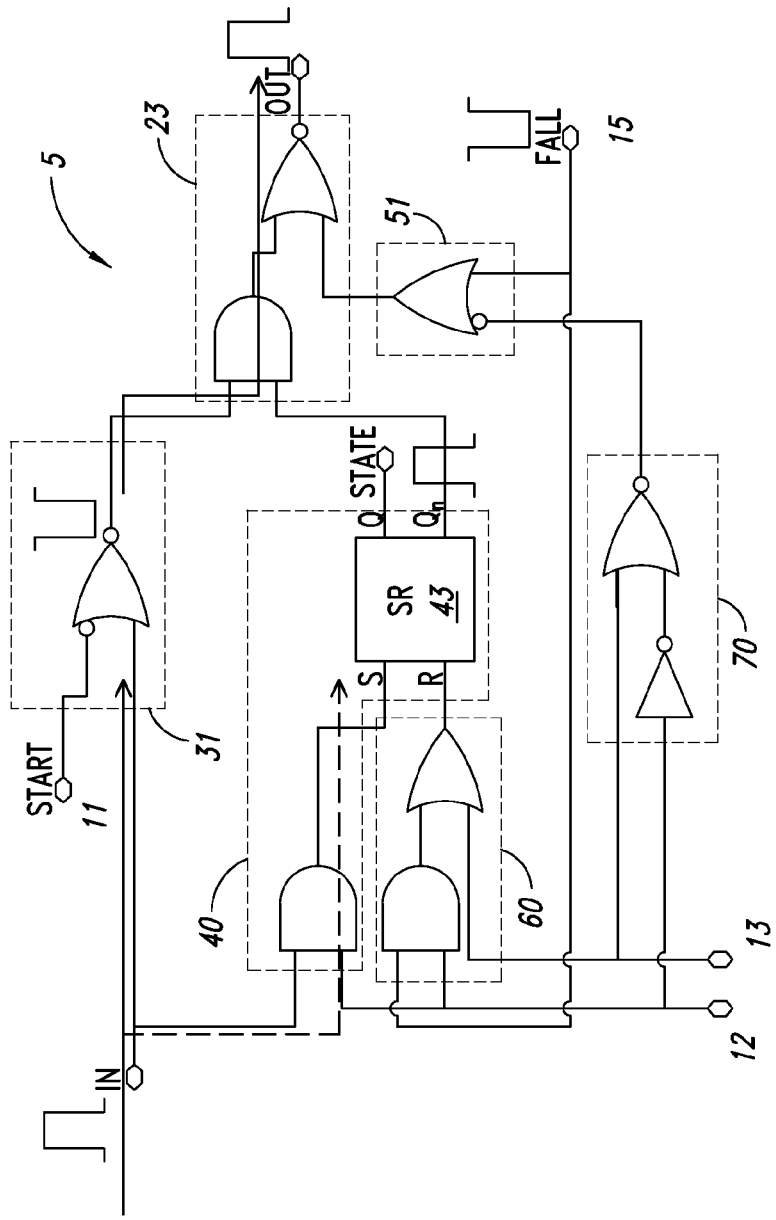

FIG. 10A, in the initial state "0" or low logic level, the input terminal IN and the output terminal OUT are at this low logic level "0" just like the auxiliary recovery terminal 15, while the output of the first logic block 31 and the output of the second logic block 40 are at high logic level "1".

When a rising edge of the cyclic signal CLK arrives at the input terminal IN it crosses the first path, switching quickly the first logic block 31 and the output block 23 and the output terminal OUT switches quickly at high logic level "1".

In the meantime, the cyclic signal CLK also crosses the second path switching the second logic block 40 which in particular forces the first input Set of the Latch 43 and thus while the first output Q is brought to high logic level "1", the second output QN, is brought to low logic level "0", and being coupled to the second input 29 of the output block 23, maintains at high logic level the output terminal OUT.

Figure 10C:
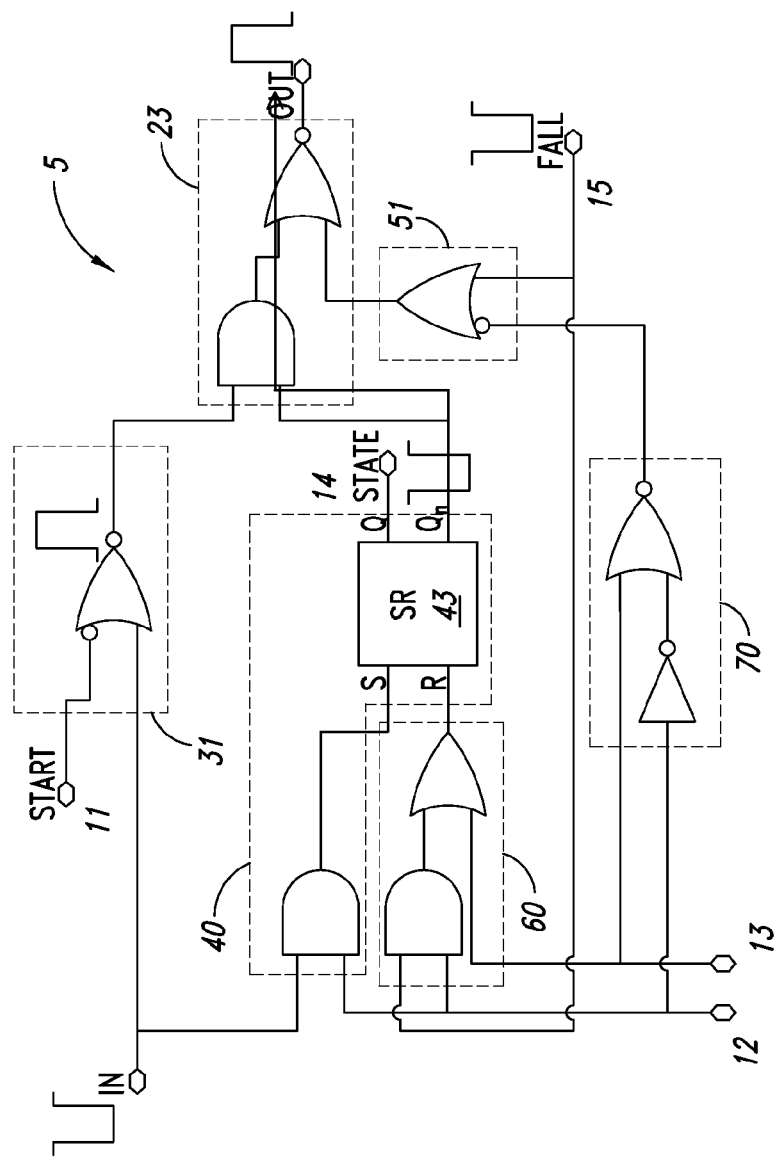

In this way, it is ensured that even if the cyclic signal CLK at the input terminal IN goes back to low logic level "0", as shown in particular in FIG. 10C, the output terminal OUT is maintained at high logic level "1", dues to the presence of the second logic block 40 which maintains the second output QN of the Latch 43 at low logic level "0" and which, independently from the logic level of the first logic block 31, maintains the output logic block 23 at high logic level "1".

Figure 10D:
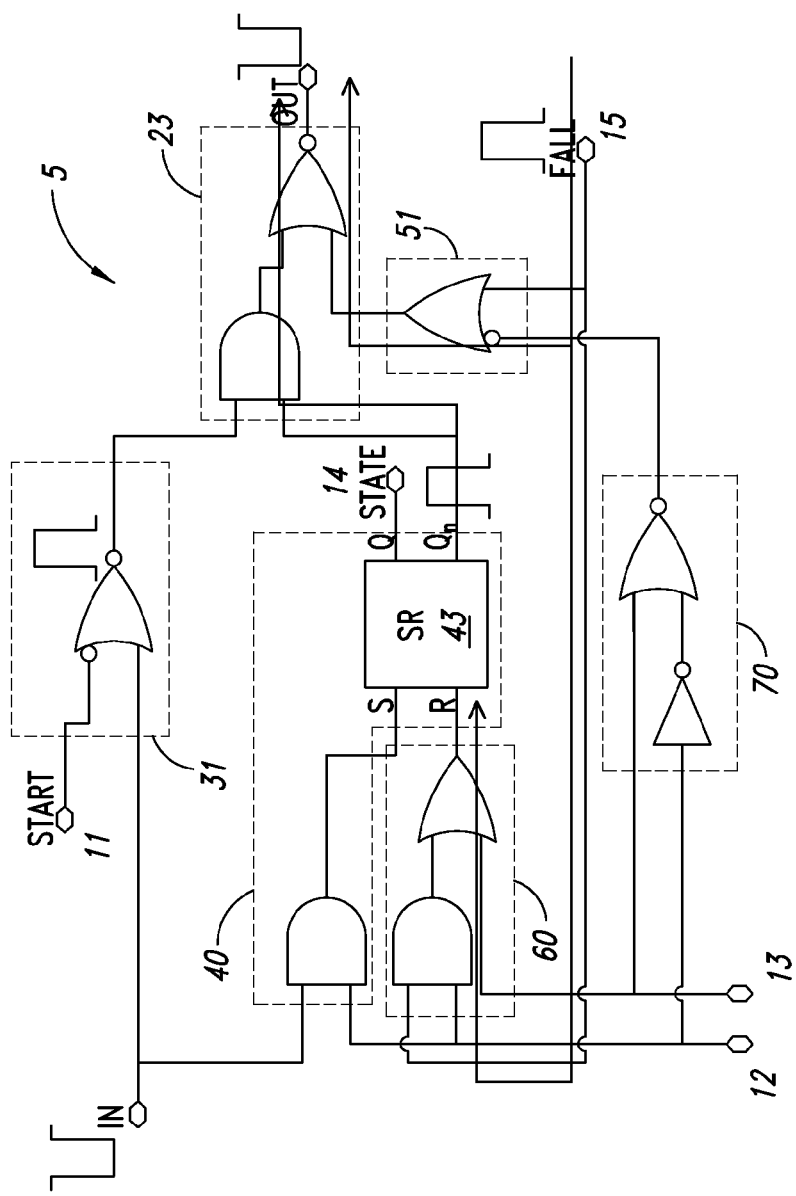

Subsequently, as shown in FIG. 10D, when a rising edge of the auxiliary recovery signal FALL arrives at the auxiliary recovery terminal 15 it crosses the third path switching quickly the third logic block 51 as well as the output logic block 23 and then bringing the output terminal OUT back to the initial state i.e., at low logic level "0".

In the meantime, the auxiliary recovery signal FALL also crosses the fourth path switching the output of the state element 61 which brings back to a high logic level "1" the second output QN of the second logic block 40 forcing the second input Reset of the Latch 43 to high logic level "1" and then the output terminal OUT of the output logic block 23 to low logic level "0".

This, naturally, independently from the value of the auxiliary recovery signal FALL which, in the meantime, could be, for possible disturbances or other, switched to the low logic level "0".

At this point, when the auxiliary recovery signal FALL is switched to low logic level "0", the elementary unit 5 is brought in a forced way back to the initial state ready to receive again the cyclic signal CLK.

Naturally, for a good operation of the elementary unit 5, it is suitable that the cyclic signal CLK is maintained at a high logic level "1" for a minimum time given by the switch time of the Latch 43 of the second logic block 40.

The relation for the determination of this minimum time is:

$$t_{pulse} > t_{AND} + t_{SR,QN} - t_{INV,1}$$

where:
$t_{pulse}$ is the time of the pulse of the cyclic signal CLK;
$t_{AND}$ is the switch time of the logic gate 42 AND of the second logic block 40;
$t_{SR,QN}$ is the activation time of the second output QN of the Latch 43;
$t_{INV,1}$ is the switch time of the first logic block 31.

To ensure that the initial state of the elementary unit 5 is recovered prior to the arrival of a successive cyclic signal CLK it is thus necessary that the following relation occurs:

$$t_{fo} < t_d + t_{pulse}$$

i.e.

$$t_{pulse} > t_{fo} - t_d$$

where:
$t_{fo}$ is the time period between the rising edge of the auxiliary recovery signal FALL and the falling edge of the output signal at the output terminal OUT;
$t_{pulse}$ is the duration of the pulse of the auxiliary recovery signal FALL
$t_d$ is the delay of a logic gate.

The recovery signal Reset received at the third terminal 13 is received both at the second input Reset of the Latch 43 by means of the state element 61, and at the input of the second state element 23 through the control element 70 and the third logic block 51, this allowing to recover the initial state simultaneously for the whole elementary unit 5.

The embodiment of the logic gates remains however a strategic realization choice according to the elementary unit and to the use of the ring oscillator.

In particular, the Applicant has verified that an embodiment of the elementary unit 5 implemented by means of transistors, allows to reach good performance and facilitates minimizing the capacity and maximizing the ratio speed/power reducing the sizes of the paths of the signals inside and outside the elementary unit itself.

Figure 11:
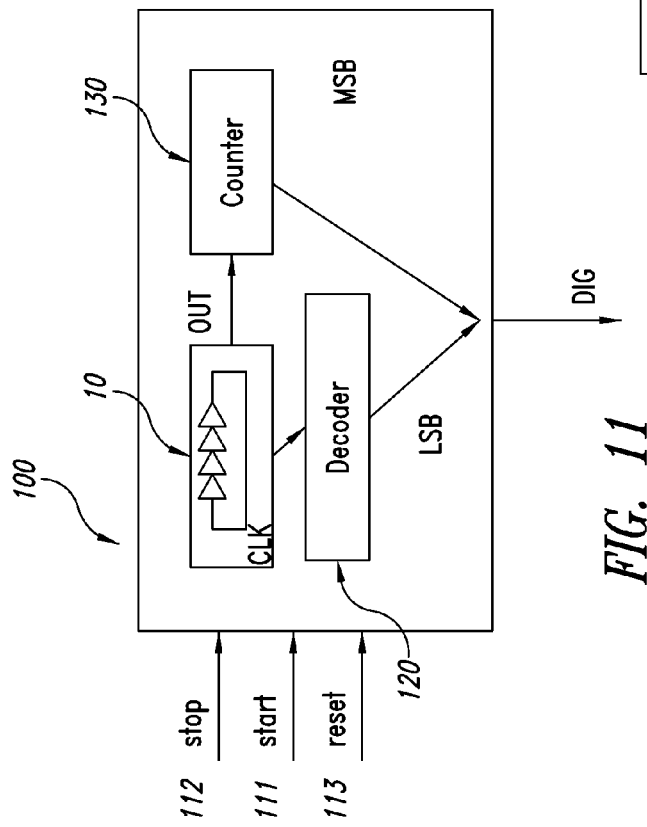
FIG. 11 schematically shows a converter circuit A/D made according to an embodiment.

As schematically shown in FIG. 11, a Time-to-Digital converter circuit 100 comprises a ring oscillator 10, for example, an embodiment of the ring oscillator 10 shown in FIG. 6, which is coupled to a loop counter 130 and to a state decoder 120.

The Time-to-Digital converter circuit 100 comprises a first activation terminal 111, suitable for receiving a start signal Start, a second deactivation terminal 112, suitable for receiving a stop signal Stop and a third recovery terminal 113 suitable for receiving a recovery signal Reset for bringing the Time-to-Digital converter circuit 100 back to an initial state.

In particular, the Time-to-Digital converter circuit allows to convert into a digital number DIG a time period $\Delta t$ between the start signal Start and the stop signal Stop.

According to an embodiment, the activation terminal 111 and the deactivation terminal 112 could be a single terminal suitable for receiving a single start/stop signal.

In the embodiment illustrated in FIG. 11, the first activation terminal 111, the second deactivation terminal 112 and the third recovery terminal 113 are coupled respectively to the first activation terminal 11 to the second deactivation terminal 12 and to the third recovery terminal 13 of the ring oscillator 10 (see FIG. 6) and allow respectively to activate, to deactivate and to reset the ring oscillator 10. One or more inverters may be employed in some embodiments. The activation signal START 111 is coupled to one of the elements of the ring oscillator 10, while the STOP 112 and RESET 113 signals are coupled to all of the elements of the ring oscillator 10.

The ring oscillator 10 has an output terminal OUT associated with the loop counter 130 which counts the loops of the cyclic signal CLK in the ring oscillator 10 during the time period $\Delta t$.

Moreover, the ring oscillator 10 comprises a plurality of elementary units 5 arranged in cascade and linked to each other in order to make a chain which suitably comprise a non-inverting logic element 7 that brings back to one of its own output terminals OUT the same rising edge of the cyclic signal CLK present at one of its input terminals IN, as above described. Each elementary unit 5 also has an auxiliary recovery terminal 15 suitable for receiving an auxiliary recovery signal FALL for temporarily resetting each elementary unit 5 during each loop of the input signal CLK in the ring oscillator 10.

In particular, the auxiliary recovery terminal 15 of an elementary unit 5 of the chain is suitably coupled to the output terminal OUT of an elementary unit 5 of the successive chain for receiving, in inner feedback, the signal present at the output terminal OUT as auxiliary recovery signal FALL. This allows to bring the elementary unit 5 which receives the auxiliary recovery signal FALL back to the initial state before the cyclic signal CLK goes back to its own input terminal IN thus generating a clocked recovery inside the ring oscillator 10.

According to an embodiment, the auxiliary recovery terminal 15 of an elementary unit 5 of the chain is suitably coupled to the output terminal OUT of a second successive elementary unit 5 of the chain.

Moreover, each elementary unit 5 has a fourth state terminal 14, suitable for supplying an identifying signal of the state of the elementary unit 5.

In particular, the fourth state terminal 14 of each elementary unit 5 is coupled to the state decoder 120, which determines the position of the cyclic signal CLK inside the ring oscillator 10 at the arrival of the stop signal Stop at the deactivation terminal 112.

The state decoder 120 for determining the last elementary unit 5 of the series that has the received cyclic signal CLK determines the state terminal 15 which has the high logic level "1" with the successive state terminal 15 at low logic level "0".

Thus, while the loop counter 130 determines the integer part of the digital number DIG, i.e., the most significant bits MSB of the time period Δt, the state decoder 120 determines the fractional part i.e., the least significant bits LSB of the digital number DIG.

The ring oscillator 10 can have any number of elementary units 5 in cascade, and in particular differently with respect to the prior art, the elementary units 5 of the chain can also be of even number.

In an embodiment, the ring oscillator 10 has a number of elementary units 5 corresponding to a power of two.

In this way, the loop counter 130 and the state decoder 120 may have an extremely simplified circuit shape, which allows to remarkably reduce the requested integration area.

Figure 12:
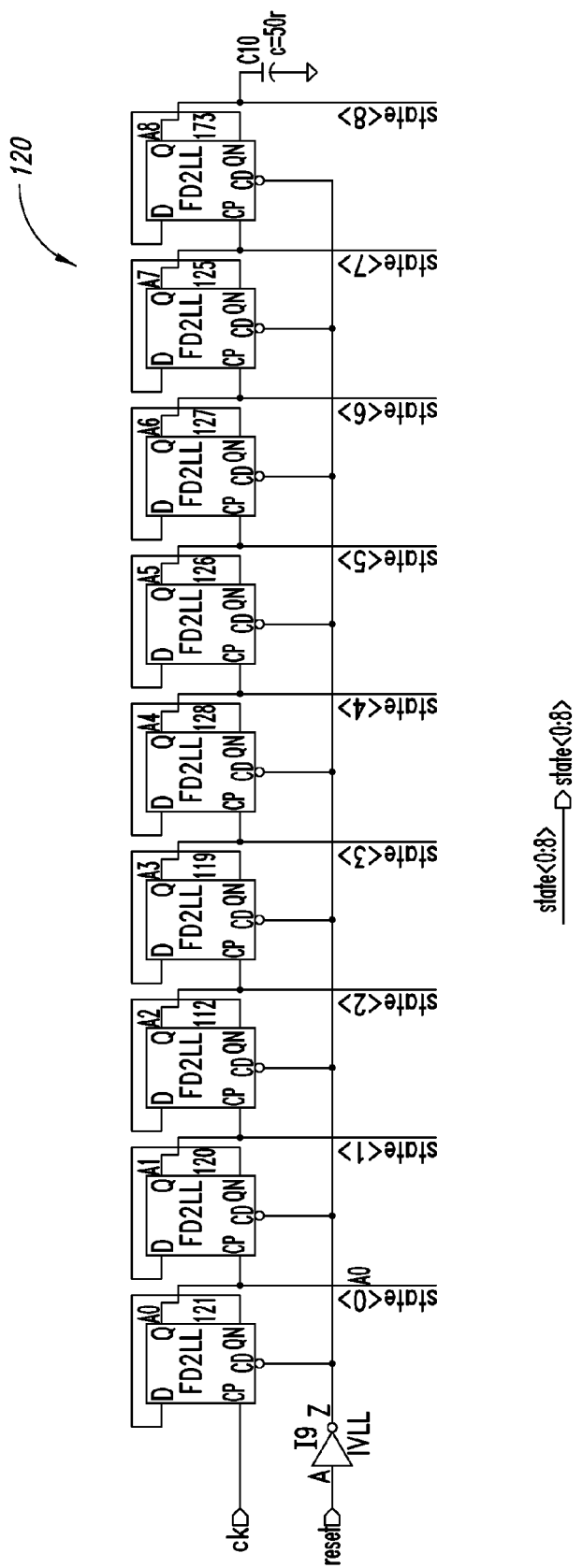
FIG. 12 schematically shows an embodiment of a counter for the converter circuit A/D of FIG. 11.

An embodiment for the loop counter 130 is shown in FIG. 12, which as illustrated is realized by means of a chain of two-state memory elements, which, in this case, are Flip-Flops, that in one embodiment are of the D type, whose number depends on the number of bits to be represented. This Figure shows a shape for the binary coding, and in particular, a chain of nine Flip/Flops coupled in cascade, the first of which is the so called zero element and receives the signal from the output of the ring oscillator 10 and not from a preceding Flip-Flop.

Suitably, the time-to-digital converted circuit, according to an embodiment, allows to measure with a high resolution both short times and long times, this resolution being comparable to that of a delay of an elementary unit 5 i.e., to that of a logic gate.

Example embodiments of methods will be described below with reference to the elements of the embodiments of a Time-to-Digital converter of FIG. 11 and of a ring oscillator of FIG. 6.

In an embodiment, a method comprises the steps of:
arranging a plurality of elementary units 5 in cascade with the input terminal IN of an elementary unit 5 coupled to the output terminal OUT of a successive elementary unit 5 of the series so that they are linked in a chain;
enabling a cyclic signal CLK during a time period Δt of activation of said ring oscillator, this cyclic signal CLK crossing in series each elementary unit 5 of said chain.

In an embodiment, the method further comprises the step of:
temporarily resetting each elementary unit 5 during each loop of said cyclic signal CLK by means of inner feedback, in said ring oscillator 10, of an auxiliary recovery signal FALL.

The method thus providing to couple, by means of inner feedback, an output terminal 15 of a successive elementary unit 5 of the chain to an auxiliary recovery terminal 15 of a preceding elementary unit 5, said auxiliary recovery terminal 15 suitable for receiving said auxiliary recovery signal FALL.

In one embodiment, the method provides to connect the auxiliary recovery terminal 15 of each elementary unit 5 of the chain to the output terminal OUT of a second successive elementary unit 5 of the chain.

The method also comprises the step of:
realizing each elementary unit 5 by means of a non-inverting logic element 7, which brings back to one of its own output terminals OUT the same propagating edge (e.g., rising or falling edge) of the cyclic signal CLK present at a respective input terminal IN. In particular, the non-inverting logic element 7 defines a first fast transmission path of the signal from the input terminal IN to the output terminal OUT.

In particular, the non-inverting logic element 7 may be realized by arranging in cascade two inverting elements: a first logic block 31 of fast transmission of the signal, coupled to the input terminal IN, and an output logic block 23 coupled to the output terminal OUT of the elementary unit 5.

The output logic block 23 may be realized as a logic gate AND-NOR with a single circuit stage and provides three inputs and one output and in particular, a first input 28 coupled to the output of the first logic block 31.

The step of realizing the elementary units 5 also provides to realize a second path of confirmation of the cyclic signal CLK by means of a second logic block 40, also substantially inverting, interconnected between the input terminal IN and the output logic block 23.

Suitably, the second logic block 40 is realized by arranging in cascade a logic gate 42, of the AND type, coupled to the input terminal IN, and associated with a two-state memory element 43 in particular a Latch 43 of the Set/Reset type. In particular, the logic gate 42 is realized by connecting the output to a first input Set of the Latch 43. The Latch 43 is realized with a first output coupled to the state terminal 14 of the elementary unit 5 and a second output coupled to a second input 29 of the output logic block 23.

Moreover, the step of realizing each elementary unit 5 provides also to realize a third path of fast transmission for the auxiliary recovery signal FALL. In particular, the third path is realized by means of a third logic block 51, of the non-inverting type, interconnect between the auxiliary recovery terminal 15 and the output logic block 23.

Further, the step of realizing each elementary unit 5 provides to realize a fourth steady storage path of the auxiliary recovery signal FALL. In particular, the fourth path is realized by a non-inverting state element 61 interconnected, substantially, between the auxiliary recovery terminal 15 and the second logic block 40 and in particular at the second input Reset of the two-state memory element 43. This state element 61 is also coupled to the second deactivation terminal 12 and to the third recovery terminal 13 of the elementary unit 5 thus allowing to disable and reset the second logic block 40.

Finally, the step of realizing each elementary unit 5 provides to realize a control element 70 that coupled to the second deactivation terminal 12 and to the third recovery terminal 13 of the elementary unit 5 allows to disable and reset the third logic block 51.

Suitably, according to an embodiment, the logic block 51 quickly resets the output logic block 23 bringing back the output terminal OUT of an elementary unit 5 of the ring oscillator 10 back to a known state for the whole time period wherein the auxiliary recovery signal FALL crosses the fourth path. Advantageously, then, for this time period a stability is ensured of the state of the input terminal IN of the successive elementary unit 5 of the chain, while the preceding elementary unit 5 is reset.

In an embodiment, a method of time-to-digital measure for converting a time period Δt into a digital number DIG, uses a ring oscillator as previously described for which details and cooperating parts having the same structure and function will be indicated with the same reference numbers and acronyms.

The method, according to an embodiment, provides the steps of:
- realizing a ring oscillator 10 by arranging a plurality of elementary units 5 in cascade with the input terminal of an elementary unit 5 coupled to the output terminal OUT of a successive elementary unit 5 of the series so that they are linked in a chain and, by means of inner feedback, temporarily resetting each elementary unit 5;
- activating said ring oscillator 10 for the time period $\Delta t$ enabling a cyclic signal CLK that crosses in sequence said elementary units 5;
- counting the loops of the cyclic signal CLK in the ring oscillator 10 during the time period $\Delta t$ and
- determining the elementary unit 5 of the ring oscillator 10 comprising the cyclic signal CLK at the end of said time period $\Delta t$.

The method also provides the step of realizing said ring oscillator according to the above described method.

In particular, the method provides to use a number of elementary units 5 corresponding to a power of two.

The method also provides the step of counting the loops by arranging a loop counter 130.

In one embodiment, the loop counter 130 is realized by arranging a chain of two-state memory elements in a shape for the binary coding by connecting the input of the first memory element to the output terminal of the ring oscillator 10.

This allows, advantageously, to simplify the circuit and allows to reduce the integration area requested an arithmetic logic unit being no longer necessary.

An advantage of the ring oscillator according to an embodiment is its simplicity and strength that due to the clocked inner feedback ensures the temporary recovery of each elementary unit in each loop of the cyclic signal, allowing a correct transfer to the output terminal of the edge of the signal present at the input terminal as well as an excellent operation of the ring oscillator.

A further advantage of an embodiment of the ring oscillator is the circuit simplicity of the auxiliary recovery obtained as inner feedback of the output signal present in a successive elementary unit of the chain.

Another remarkable advantage of an embodiment is given by the possibility of realizing a ring oscillator with a chain made by any number of elementary units and in particular, differently with respect to the prior art, these elementary units can be of even number.

Another advantage of an embodiment of the ring oscillator is the stability with which the cyclic signal is transmitted from the input terminal to the output terminal which determines the reliability of the same ring oscillator. This stability being obtained by means of the first fast transmission logic block and in particular, dues to the second logic block which allows to stabilize the state of the elementary unit according to the input signal. Similarly, the third logic block, the state element and the two-state memory element, of the second logic block, ensure stability for the receipt of the auxiliary recovery signal.

An advantage of a time-to-digital converter circuit according to an embodiment is given by the circuit simplicity as well as by the limited integration area requested. In fact, the use of a ring oscillator with any number of elementary units and in particular even allows to limit or to completely delete the Arithmetic Logic Unit. Moreover, to realize the ring oscillator with a number of elementary units corresponding to a power of two facilitates eliminating Arithmetic Logic Units, reducing in a significant way the circuit complexity both as regards the loop counter and as regards the state decoder.

Another advantage of an embodiment is given by the possibility of measuring both short times and long times by means of the same embodiment of a time-to-digital converter circuit. The maximum time measurable by the Time-to-Digital converter circuit essentially depends on the realization of the loop counter coupled to the ring oscillator and in particular on the number of elements composing this loop counter.

Another remarkable advantage of an embodiment is given by the high resolution obtained by the time-to-digital converter circuit, substantially equal to the time of a logic gate.

Further advantage of an embodiment is given by the low power required for the operation both for the ring oscillator and for the time-to-digital converter circuit.

Another advantage of an embodiment is given by the possibility of realizing the ring oscillator and the time-to-digital converter circuit independently from the technology used, which can be chosen essentially according to the layout needs.

Obviously a technician of the field will be allowed to bring several modifications to the ring oscillator, to the time-to-digital converter circuit and to the method above described so as to meet contingent and specific needs all within the scope of the disclosure.

Some embodiments may take the form of computer program products. For example, according to one embodiment there is provided a computer readable medium comprising a computer program adapted to perform one or more of the methods described above. The medium may be a non-transitory medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), discrete circuitry, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology. In some embodiments, some of the modules or controllers separately described herein may be combined, split into further modules and/or split and recombined in various manners.

The systems, modules and data structures may also be transmitted as generated data signals (e.g., as part of a carrier wave) on a variety of computer-readable transmission mediums, including wireless-based and wired/cable-based mediums.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A ring oscillator comprising a plurality of elementary units coupled together in cascade and configured to form a chain with respective output terminals coupled to input terminals of successive elementary units of said chain, said elementary units being crossed by a cyclic signal during a time period of activation, wherein each of said elementary units comprises an auxiliary recovery terminal coupled to an output terminal of a successive elementary unit in said chain, and each elementary unit is configured to temporarily reset itself during each loop of said cyclic signal.

2. The ring oscillator according to claim 1 wherein each of said elementary units comprises a non-inverting logic element configured to provide at the output terminal of the respective elementary unit a same propagating edge of said cyclic signal present at the input terminal of the respective elementary unit, wherein the same propagating edge is a rising edge.

3. The ring oscillator according to claim 2 wherein said non-inverting logic element comprises a first logic block coupled to said input terminal and coupled in cascade to an output logic block coupled to the output terminal.

4. The ring oscillator according to claim 3 wherein said elementary unit comprises a second logic block coupled to said input terminal and to said output logic block, said second logic block comprising a two-state memory element.

5. The ring oscillator according to claim 4 wherein said first logic block, said second logic block and said output logic block are of an inverting type.

6. The ring oscillator according to claim 5 wherein each of said elementary units comprises a third logic block coupled to said auxiliary recovery terminal and to said output logic block, said third logic block being non-inverting.

7. The ring oscillator according to claim 6 wherein said third logic is further connected to a deactivation terminal and to a recover terminal of said elementary unit through a control element.

8. The ring oscillator according to claim 7 wherein said elementary unit comprises a state element interposed between said auxiliary recovery terminal and said two-state memory element of said second logic block, said state element being of a non-inverting type.

9. The ring oscillator according to claim 1 wherein said auxiliary recovery terminal of each elementary unit of the chain is connected to an output terminal of a successive second elementary unit of said chain.

10. A time-to-digital converter, comprising:
    a ring oscillator configured to be activated for a time period and crossed by a cyclic signal, the ring oscillator including a plurality of elementary units coupled together in cascade and configured to form a chain with respective output terminals coupled to input terminals of successive elementary units of said chain, said elementary units being crossed by the cyclic signal during the time period of activation, wherein each of said elementary units comprises an auxiliary recovery terminal coupled to an output terminal of a successive elementary unit in said chain, and each elementary unit is configured to temporarily reset itself during each loop of said cyclic signal; and
    a loop counter coupled to said ring oscillator and configured to count loops that said cyclic signal executes in said ring oscillator during said time period.

11. The time-to-digital converter according to claim 10, further comprising a state decoder associated with said ring oscillator and configured to determine a position of the cyclic signal in said ring oscillator at an end of said time period.

12. The time-to-digital converter according to claim 11 wherein said ring oscillator comprises a number of elementary units corresponding to a power of two.

13. The time-to-digital converter according to claim 12 wherein said loop counter comprises a chain of two-state memory elements.

14. A method, comprising:
    arranging a series of elementary units in cascade and linked to make a chain with an input terminal of an elementary unit coupled to an output terminal of a successive elementary unit of said chain, said chain forming a ring oscillator;
    coupling an output terminal of a successive elementary unit of the chain with an auxiliary recovery terminal, of a preceding elementary unit, configured to receive an auxiliary recovery signal;
    enabling a cyclic signal during a time period of activation of said ring oscillator, said cyclic signal crossing said elementary units; and
    temporarily resetting each elementary unit during each loop of said cyclic signal in response to inner feedback, in said ring oscillator, of the auxiliary recovery signal.

15. The method according to claim 14, comprising:
    providing in each elementary unit a first fast transmission path for said cyclic signal through a non-inverting logic element, the first fast transmission path configured to provide at the output terminal a same propagated edge of said cyclic signal present at the respective input terminal.

16. The method according to claim 15, comprising configuring in cascade a first logic block coupled to said input terminal and an output logic block coupled to said output terminal to form said first fast transmission path.

17. The method according to claim 16, comprising providing a path of confirmation of said cyclic signal through a second logic block coupled to said input terminal and to said output logic block, wherein said second logic block comprises a two-state memory element.

18. The method according to claim 17, comprising:
    providing a fast transmission path of said auxiliary recovery signal through a third logic block coupled to the auxiliary recovery terminal and to said output logic block; and
    providing a path of confirmation of said auxiliary recovery signal through a state element coupled to said auxiliary recovery terminal and to said two-state memory element of said second logic block.

19. The method of claim 14, further comprising:
    counting loops of said cyclic signal in said ring oscillator during said time period;
    determining an elementary unit of said ring oscillator comprising said cyclic signal at an end of said time period; and
    generating a digital number representing the time period based on the counting and the determining.

20. The method according to claim 19 wherein arranging said chain comprises arranging a number of elementary units corresponding to a power of two.

21. The method according to claim 20 wherein said counting loops comprises coupling an output of said ring oscillator to an input of a loop counter comprising a chain of two-state memory elements.

22. A ring oscillator, comprising:
    a plurality of elementary units coupled together to form a ring of elementary units, each elementary unit having:
        a cyclical signal input; and an output coupled to the cyclical signal input of a successive elementary unit of the ring; and a ring oscillator output coupled to the output of one of the elementary units of the ring, wherein each elementary unit is configured to temporarily reset during a cycle of the ring oscillator, wherein each of the plurality of elementary units comprises a recovery input coupled to the output of another elementary unit of the ring, and is configured to temporarily reset in response to receiving a signal on the recovery input.

23. The ring oscillator of claim 22 wherein the output of a respective elementary unit is coupled to the cyclical signal input of a first successive elementary unit of the ring and to the recovery input of a second successive elementary unit of the ring.

24. The ring oscillator of claim 22 wherein the elementary units are non-inverting logic elements.

25. A ring oscillator, comprising:
a plurality of elementary units coupled together to form a ring of elementary units, each elementary unit being a non-inverting logic element having:
a cyclical signal input; and
an output coupled to the cyclical signal input of a successive elementary unit of the ring; and
a ring oscillator output coupled to the output of one of the elementary units of the ring, wherein each elementary unit is configured to temporarily reset during a cycle of the ring oscillator wherein a non-inverting logic element of a respective elementary unit comprises a first logic block and an output logic block coupled in series between the cyclical input terminal and the output terminal of the respective elementary unit.

26. The ring oscillator of claim 25 wherein said respective elementary unit comprises a second logic block coupled in series with the output logic block between the cyclical input terminal and the output terminal of the respective elementary unit, said second logic block comprising a two-state memory element.

27. The ring oscillator of claim 26 wherein said first logic block, said second logic block and said output logic block are of an inverting type.

28. The ring oscillator of claim 27 wherein said respective elementary unit comprises a third logic block coupled in series with the output logic block between the recovery terminal and the output terminal of the respective elementary unit, said third logic block being non inverting.

29. The ring oscillator of claim 22 wherein a respective elementary unit comprises a state element configured to output a signal indicative of a state of the respective elementary unit.

30. The ring oscillator of claim 22 wherein the plurality of elementary units comprises an even number of elementary units.

31. The ring oscillator of claim 30 wherein the even number is a power of two.

32. A system, comprising:
a ring oscillator, including:
a plurality of elementary units coupled together to form a ring of elementary units, each elementary unit having:
a cyclical signal input; and
an output coupled to the cyclical signal input of a successive elementary unit of the ring; and
a ring oscillator output coupled to the output of one of the elementary units of the ring, wherein each elementary unit is configured to temporarily reset during a cycle of the ring oscillator; and
a loop counter coupled to the output of the ring oscillator and configured to count cycles of the ring oscillator during a time period, wherein each of the plurality of elementary units comprises a recovery input coupled to the output of another elementary unit of the ring, and is configured to temporarily reset in response to receiving a signal on the recovery input.

33. The system of claim 32, further comprising a state decoder coupled to the plurality of elementary units and configured to determine a position of a cyclical signal in the ring oscillator at an end of the time period.

34. The system of claim 32 wherein the plurality of elementary units comprises an even number of elementary units which is a power of two.

35. The system of claim 32 wherein the loop counter comprises a chain of two-state memory elements.

36. A system, comprising:
a plurality of means for following a cyclical input signal coupled together in a loop; and
means for temporally resetting the means for following during a cycle of the loop.

37. The system of claim 36, further comprising means for counting cycles of the loop during a time period.

38. The system of claim 37, further comprising means for decoding a state of the plurality of means for following.

39. The ring oscillator of claim 22 wherein the elemental units comprise non-inverting logic elements and a non-inverting logic element of a respective elementary unit comprises a first logic block and an output logic block coupled in series between the cyclical input terminal and the output terminal of the respective elementary unit.

* * * * *